United States Patent
Ausserlechner et al.

(10) Patent No.: US 6,621,334 B2
(45) Date of Patent: Sep. 16, 2003

(54) FREQUENCY-COMPENSATED, MULTISTAGE AMPLIFIER CONFIGURATION AND METHOD FOR OPERATING A FREQUENCY-COMPENSATED AMPLIFIER CONFIGURATION

(75) Inventors: Udo Ausserlechner, Villach (AT); Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/331,534

(22) Filed: Dec. 30, 2002

(65) Prior Publication Data

US 2003/0102908 A1 Jun. 5, 2003

Related U.S. Application Data

(63) Continuation of application No. PCT/DE01/02347, filed on Jun. 26, 2001.

(51) Int. Cl.[7] .................................................. H03F 1/02
(52) U.S. Cl. .......................... 330/9; 330/292; 330/10; 327/124
(58) Field of Search ........................ 330/9, 10, 292, 330/107, 109; 327/124

(56) References Cited

U.S. PATENT DOCUMENTS

| 4,609,877 A | * | 9/1986 | Nicollini et al. ............... 330/9 |
| 5,621,319 A |   | 4/1997 | Bilotti et al. |
| 5,708,376 A |   | 1/1998 | Ikeda |
| 5,745,002 A | * | 4/1998 | Baschirotto et al. ........ 327/554 |
| 6,037,836 A | * | 3/2000 | Yoshizawa ..................... 330/9 |

FOREIGN PATENT DOCUMENTS

| DE | 4218533 C2 | 8/1994 |
| EP | 0866548 A1 | 9/1998 |
| JP | 59-224906 | 6/1983 |
| JP | 60-128702 | 7/1985 |
| NL | 1001231 | 5/1997 |
| WO | WO 84/04421 | 11/1984 |

OTHER PUBLICATIONS

Enz C. et al.: "A CMOS Chopper Amplifier", IEEE Journal of Solid–State Circuits, vol. SC–22, No. 3, Jun. 1987, pp. 335–342.

Munter P.: "Spinning–Current Method for Offset Reduction in Silicon Hall Plates", Delft University Press, 1992, pp. 39–43.

* cited by examiner

Primary Examiner—Henry Choe
(74) Attorney, Agent, or Firm—Laurence A. Greenberg; Werner H. Stemer; Gregory L. Mayback

(57) ABSTRACT

A frequency compensation circuit includes a first and a second compensation capacitor for a frequency-compensated amplifier to which a chopped useful signal can be supplied. In a first clock phase, the useful signal is respectively supplied to the first compensation capacitor, and in a second clock phase the useful signal is respectively supplied to the second compensation capacitor. As a result, a stable, frequency-compensated amplifier is specified in which charge reversal in the frequency compensation capacitors or Miller capacitors is avoided, making possible a configuration with a small chip area. The principle is suited particularly to Hall sensors operated in chopped mode.

21 Claims, 6 Drawing Sheets

FREQUENCY-COMPENSATED, MULTISTAGE AMPLIFIER CONFIGURATION AND METHOD FOR OPERATING A FREQUENCY-COMPENSATED AMPLIFIER CONFIGURATION

CROSS-REFERENCE TO RELATED APPLICATION

This application is a continuation of copending International Application No. PCT/DE01/02347, filed Jun. 26, 2001, which designated the United States and was not published in English.

BACKGROUND OF THE INVENTION

Field of the Invention

The invention relates to a frequency-compensated, multistage amplifier configuration and to a method for operating a frequency-compensated amplifier configuration.

It is a conventional practice to use chopper amplifiers for offset-free, low-drift amplification of low-frequency signals. Such amplification involves the useful signal that is to be amplified by the amplifier having a chopper frequency applied to it both at the input and at the output. The input of the amplifier, accordingly, has a chopped useful signal applied to it that is amplified and is demodulated at the output of the amplifier with the correct phase. In such a case, the chopper signal is normally a square-wave signal.

Such a chopper amplifier is described, by way of example, in Enz et al.: "A CMOS Chopper Amplifier", IEEE Journal of Solid-State Circuits Vol. SC-22, No 3, June 1987 pp. 335–341. However, spikes arise in this case. Filter measures are used to attempt to eliminate the effects thereof on the residual offset.

Japanese Patent document 59-224906 A specifies a chopper amplifier in which switched capacitors are provided to reduce stray capacitances in a negative feedback loop.

In addition, switched-capacitor circuits exist in which cyclic switching and charge reversal in capacitors, likewise, result in the amplifier output producing a square-wave voltage of high amplitude that has the useful signal superimposed on it.

A drawback of these circuits is that stray capacitances in the amplifier and load capacitances at the output result in the output signal from the amplifier lagging behind its input signal. To compensate for these phase shifts that arise at high frequencies, which are disadvantageous particularly when a plurality of amplifier stages are disposed in series and, as a result, an amplifier configuration can become unstable, it is conventional to use frequency compensation capacitors, "Miller capacitors," which attenuate the gain at high frequencies. In such a context, the stability of the amplifier is achieved by reducing the gain-bandwidth product (GBW).

With chopped amplifier operation, the frequency compensation capacitors need to undergo charge reversal for every state change in the chopper signal. This has the drawback that sensitive measurement amplifiers and a given analog bandwidth and accuracy allow only low chopper frequencies to be produced. A low chopper frequency results in poor noise properties as a result of flicker effects and in higher signal delay times in the sampling amplifier.

Even designing the most broadband and fastest amplifiers possible that allow high chopper frequencies is disadvantageous on account of the relatively high power consumption and the relatively large amount of chip area required. In addition, a relatively high level of thermal noise is produced as a result of the relatively high gain-bandwidth product.

U.S. Pat. No. 5,621,319 to Bilotti et al. discloses a method for compensating for the directional offset voltage that is normally produced with Hall sensors. In such a case, the exciter current from the Hall sensor is cyclically switched between two terminal pairs for supplying the exciter current that are disposed at right angles to one another, while the Hall voltage can be picked off on the respective other terminal pair. This produces a similar problem to that with the chopper amplifier described because a chopped output signal from the Hall sensor needs to be amplified. With the chopped Hall principle too, the amplified, modulated signal is demodulated with the correct phase at the amplifier output, for example, by integration, with the offset voltage being largely eliminated on average over time.

The document "Spinning-current method for offset reduction in Silicon Hall plates" by Peter Jan Adriaan Munter, Delft University Press 1992, page 12 likewise specifies a Hall element that is operated in chopped mode and in which the Hall sensor has a multiplicity of connections that are interchanged cyclically, the Hall voltage respectively being able to be picked off on a terminal pair that is disposed at right angles to the terminal pair for the exciter current.

All the chopper amplifiers described have the common drawback that either high gain factors can be produced for a low chopper frequency and, hence, also for a low analog bandwidth, or relatively high bandwidths can be produced only with lower gains and with high power loss, that a large chip area is required and that they have poor noise properties.

SUMMARY OF THE INVENTION

It is accordingly an object of the invention to provide a frequency-compensated, multistage amplifier configuration, and method for operating a frequency-compensated amplifier configuration that overcome the hereinafore-mentioned disadvantages of the heretofore-known devices and methods of this general type and that allows large gain bandwidths to be produced for a small chip area requirement and has a low power consumption, a low noise, and high levels of accuracy and stability.

With the foregoing and other objects in view, there is provided, in accordance with the invention, a frequency-compensated, multistage amplifier configuration, including an input amplifier stage having an input and an output, an output amplifier stage having an input connected to the output of the input amplifier stage and output, a modulator connected to the input of the input amplifier stage, the modulator supplying the input amplifier stage with a useful signal chopped into a first and a second clock phase, a first Miller compensation capacitor electrically activatable between the input of the output amplifier stage and the output of the output amplifier stage during the first clock phase, and a second Miller compensation capacitor electrically activatable between the input of the output amplifier stage and the output of the output amplifier stage during the second clock phase.

In line with the invention, the Miller compensation capacitor used for an amplifier in the output stage needs to be provided in duplicate so that, when a chopped input signal is supplied, the first capacitor is active during a first clock phase and the second capacitor is active during a second clock phase. Such a configuration avoids the need for cyclic charge reversal in the compensation capacitor. This is so because, after just a few clock cycles, both the first capacitor and the second capacitor are charged and in further clock cycles follow only the small voltage differences that are caused by the useful signal and that have smaller amplitudes and are slower as compared with the voltage differences caused by the chopper clock frequency.

The amplifier, therefore, allows continuous-time signal processing, in contrast to switched capacitor filters operating based upon the sample-and-hold principle.

In a chopper amplifier, the first and second clock phases differ by virtue of the useful signal having a square-wave function of high amplitude superimposed on it so that the useful signal is available in uninverted form during the first clock phase and is available in inverted form during the second clock phase.

Alternatively, the useful signal can be chopped so that the amplifier can be supplied with the useful signal unchanged during one clock.phase and with an offset equalization signal during another clock phase.

The present principle avoids cyclic charge reversal in Miller or compensation capacitors in the frequency-compensated amplifier.

The basic advantage of the configuration described, therefore, has its basis in that, when dimensioning the amplifier, it is no longer necessary to take into account the requirements in the frequency range of the chopper clock frequency, but, instead, constructing the amplifier involves taking into account the actual useful signal bandwidth, which is usually much lower than the chopper frequency. Such a process allows the amplifier to be produced with a small chip area and low power loss with a high level of accuracy and low noise, while in the prior art compensation capacitor configuration the output signal's transient recovery time, after which the output signal differs from a steady-state final value by only 0.1%, for example, is $$\ln 10^3 \cdot \frac{A}{GBW};$$

where A=gain of the amplifier with feedback and GBW= gain-bandwidth product of the amplifier. With the shown principle of switched compensation capacitors, this transient recovery time is reduced approximately by a factor of 10. Because the respective valid compensation capacitor still stores the output voltage from the previous, corresponding clock phase, the amplifier at the input now needs to react to much smaller changes in the voltage. Hence, the change in the voltage value that the amplifier sees is only a small voltage change caused by the comparatively low-frequency useful signal. The advantage attained is particularly clear at high gain and when the amplifier has high accuracy requirements.

The frequency-compensated amplifier configuration can have more than two clock phases. This makes it suitable not only for Hall elements operated in chopped mode but also for Hall elements that operate based upon the spinning current principle.

The modulator can be an input changeover switch.

With multistage amplifiers, frequency compensation is, therefore, particularly important because it is necessary to avoid an unstable response from the amplifier configuration at high frequencies. This is because, with two series-connected amplifiers, the phase shift between the input and output can be up to 180°, which means that the normally negative feedback changes into positive feedback for the amplifier, resulting in instability. To avoid this, Miller capacitors or compensation capacitors are used. In such a case, frequency compensation is provided on the output-side amplifier stage, for example, in an operational amplifier having a plurality of amplifier stages.

In accordance with another feature of the invention, the output of a demodulator is connected to the frequency-compensated amplifier. The demodulator can be an output changeover switch or an output sample switch. To demodulate the amplified useful signal, the demodulator can have a clock signal applied to it that corresponds to that clock signal that can be supplied to the modulator or that is derived therefrom.

In accordance with a further feature of the invention, there is provided a demodulator connected to the output of the output amplifier stage, the demodulator demodulating an amplified version of the signal.

In accordance with an added feature of the invention, there is provided a demodulator connected to the output of the output amplifier stage, the demodulator demodulating a signal at the output of the output amplifier stage.

In accordance with an additional feature of the invention, the capacitance values of the first and second compensation capacitors are substantially equal and/or the same. This permits a particularly simple and symmetrical circuit design.

When the principle is applied to switched-capacitor amplifiers, however, the different gains of the configuration in the two clock phases can mean that it is advantageous for the compensation capacitors to be in asymmetrical form.

In accordance with yet another feature of the invention, to switch the compensation capacitors, a changeover switch is connected to the input of the output amplifier stage and to the capacitors whose outputs are connected to the amplifier. This changeover switch alternately connects the first or second compensation capacitor, depending on clock phase. The configuration of the switch upstream of the compensation capacitors has the advantage that switching transistors can be produced more easily on account of the defined potential levels that are at the amplifier input.

The useful signal can be in the form of a signal that is routed using differential-path technology, for example, for suppressing common-mode interference.

When designing circuits implementing the present principle, it should be remembered that simultaneous activation of the first and second compensation capacitors needs to be avoided in every operating state. By way of example, compensation capacitors can be turned on with a time delay and can actually be turned off before a change of clock phase so that there is never any overlap between the switching states. In such a case, in one advantageous embodiment of the invention, holding capacitors can be provided that are grounded at the input of the amplifier.

The invention can also be used for switched-capacitor amplifier circuits in which, during the first clock phase, the useful signal is supplied to the amplifier and, during the second clock phase, the supply of the useful signal is interrupted and an offset equalization signal is supplied.

In accordance with yet a further feature of the invention, the changeover switch for switching the first and second Miller compensation capacitors is an analog circuit with CMOS transistors.

In accordance with yet an added feature of the invention, the changeover switch for switching the first and second Miller compensation capacitors is an analog circuit with CMOS transistors.

In accordance with yet an additional feature of the invention, the signal is a differential signal.

It is within the scope of the invention for a single-stage amplifier configuration in a switched-capacitor filter to have at least one compensation capacitor grounded at the output of the frequency-compensated amplifier, which can be a transimpedance amplifier, instead of the configuration of the compensation capacitors between the input and the output of the amplifier.

It is also within the scope of the invention to provide switched compensation capacitors for multistage amplifiers, for example, three-stage or four-stage amplifiers. In such a case, the compensation capacitors can be disposed between the input and the output of the single amplifier stage and/or between the input and the output of a plurality of amplifier stages in the multistage amplifier. Combinations of switched and fixed compensation capacitors can, likewise, be appropriate.

In accordance with again another feature of the invention, there is provided a respective holding capacitor for signal lines carrying the differential signal between the modulator and the input amplifier stage, the respective holding capacitor being grounded.

In accordance with again a further feature of the invention, there are provided signal lines carrying the differential signal between the modulator and the input amplifier stage and a grounded holding capacitor connected to each of the signal lines.

In accordance with again an added feature of the invention, the modulator is a Hall sensor operated in chopped mode.

The invention can, advantageously, be used for Hall sensors operated in chopped mode in which the first and second clock phases of the modulated signal differ by the offset voltage of the Hall element.

In accordance with again an additional feature of the invention, the modulator is a chopped mode Hall sensor.

In accordance with still another feature of the invention, there is provided a demodulator connected to the output of the output amplifier stage, the demodulator demodulating a signal at the output of the output amplifier stage and having an integrator integrating the signal at the output of the output amplifier stage.

In accordance with still a further feature of the invention, the output amplifier stage is a frequency-compensated amplifier.

In accordance with still an added feature of the invention, the frequency-compensated amplifier is a switched-capacitor amplifier.

In accordance with still an additional feature of the invention, the frequency-compensated amplifier has an output and at least one of the first and second compensation capacitors is grounded at the output of the frequency-compensated amplifier.

With the objects of the invention in view, there is also provided a method for operating a frequency-compensated amplifier configuration, including the steps of providing an amplifier configuration having an amplifier with an input and an output and a modulator connected to the input of the amplifier, modulating a useful signal in the modulator to form two cyclically consecutive modulator clock phases, activating a first compensation capacitor between the input of the amplifier and the output of the amplifier during a first compensation clock phase, activating a second compensation capacitor between the input of the amplifier and the output of the amplifier during a second compensation clock phase, providing a respective no-overlap time between the first and second compensation clock phases during which neither the first compensation capacitor nor the second compensation capacitor is switched on. According to the invention, a respective no-overlap time is observed during which neither the first nor the second compensation capacitor is connected between the first and second compensation clock phases.

The timing scheme described for operating an amplifier configuration has the advantage that the first and second compensation capacitors are never simultaneously active between amplifier input and amplifier output.

In accordance with another mode of the invention, the start of the modulator clock phases, respectively, comes in the no-overlap time between the first and second compensation clock phases. Specifically, a start of the first modulator clock phase comes in the no-overlap time between the second and first compensation clock phases and a start of the second modulator clock phase comes in the no-overlap time between the first and second compensation clock phases.

In accordance with a further mode of the invention, the demodulation downstream of the amplifier takes place such that no state change in a functional unit connected upstream of the demodulator takes place during the demodulator clock phases. This largely avoids spikes in the output signal that can be derived on the demodulator.

In accordance with a concomitant mode of the invention, the amplifier is a frequency-compensated amplifier and an amplified version of the useful signal is demodulated with a demodulator connected downstream of the frequency-compensated amplifier such that the amplified useful signal can be derived at the output of the frequency-compensated amplifier unchanged during a first demodulator clock phase and in an inverted form during a second demodulator clock phase, the first demodulator clock phase starting after the start of the first compensation clock phase and ending before an end of the first modulator clock phase, and the second demodulator clock phase starting after the start of the second compensation clock phase and ending before an end of the second modulator clock phase.

Other features that are considered as characteristic for the invention are set forth in the appended claims.

Although the invention is illustrated and described herein as embodied in a frequency-compensated, multistage amplifier configuration, and method for operating a frequency-compensated amplifier configuration, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
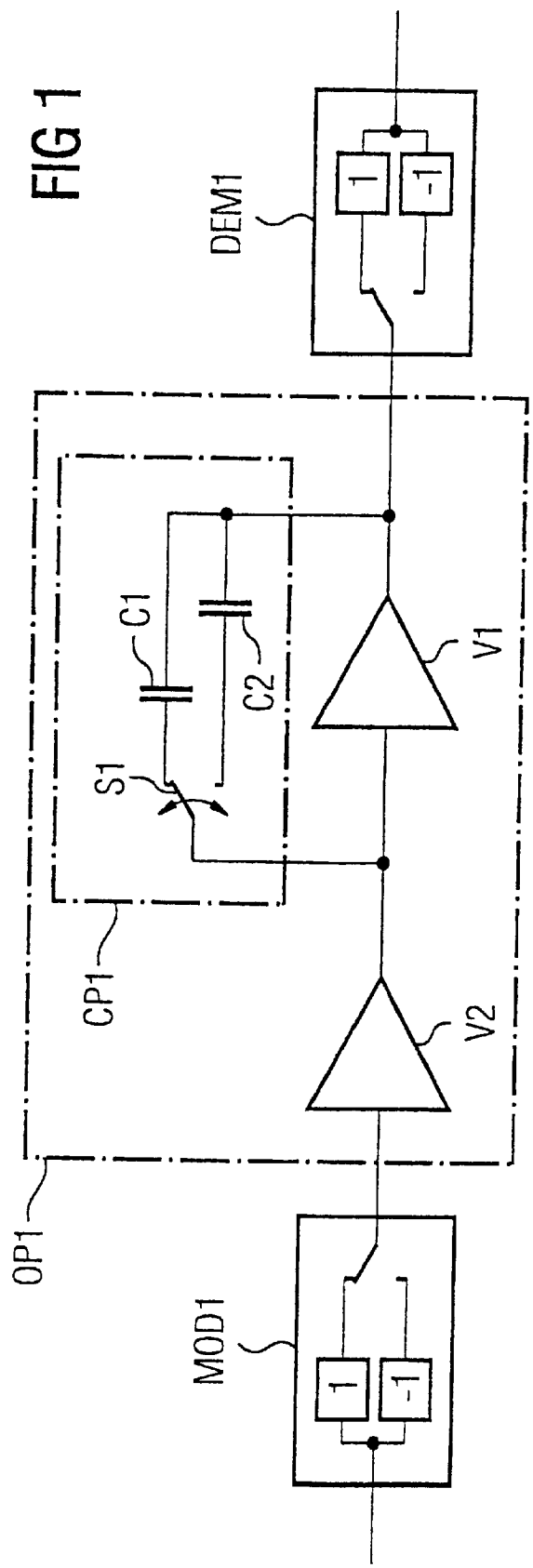
FIG. 1 is a block and schematic circuit diagram of a first exemplary embodiment applied to a chopper amplifier according to the invention.

Referring now to the figures of the drawings in detail and first, particularly to FIG. 1 thereof, there is shown an operational amplifier OP1 having a frequency-compensated amplifier V1 disposed at the output and a further amplifier V2 connected upstream of the frequency-compensated amplifier. Disposed between the input and the output of the frequency-compensated amplifier Vl, which provides the output-side, last amplifier stage of the operational amplifier OP1, is a compensation circuit CP1 that has a first compensation capacitor C1 and a second.compensation capacitor C2 disposed in parallel therewith that are configured to be able to be connected or disconnected using a first switch S1. The input of the further amplifier V2 has a modulator MOD1 connected to it that cyclically chops a useful signal such that it can be supplied in uninverted form during a first clock phase and can be supplied in inverted form during a second clock phase. The output of the frequency-compensated amplifier V1 has a demodulator DEM1 connected to it that is actuated with the same chopper clock signal as the modulator MOD1 or with a clock signal derived therefrom and that makes the modulated and amplified useful signal, which is produced at the output of the frequency-compensated amplifier V1, available with the correct phase, at its output unchanged during the first clock phase and in inverted form during the second clock phase. The switch S1 is actuated by a clock signal that is derived from the chopper clock signal for actuating the modulator and the demodulator. The modulator switch, the demodulator switch, and the compensation capacitor switch S1 are, preferably, in the form of analog switches in CMOS technology.

The chopper amplifier shown in FIG. 1 can be produced with a moderate chip area requirement and low power consumption for a high chopper frequency and high accuracy even for large gain factors.

Figure 2:
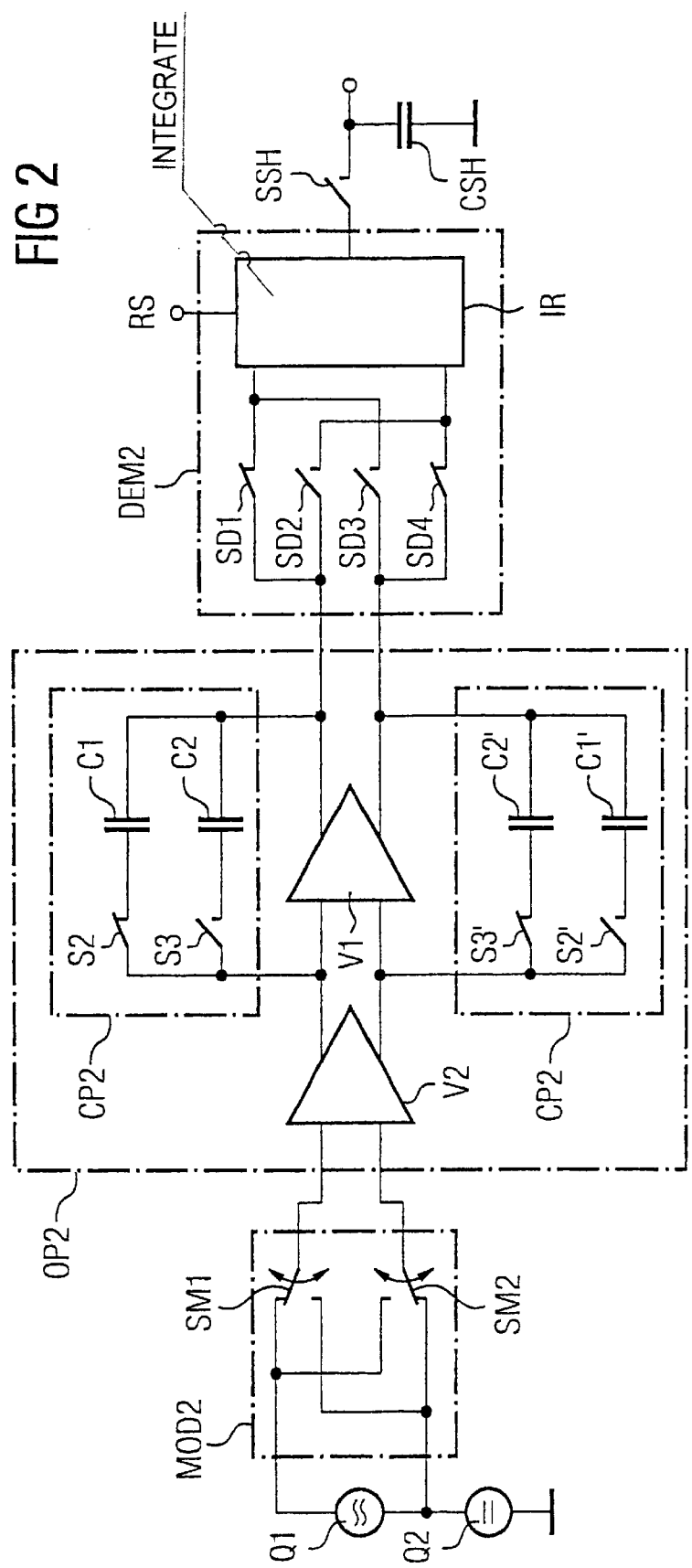
FIG. 2 is a block and schematic circuit diagram of the circuit of FIG. 1 using differential-path technology.

FIG. 2 shows the operational amplifier OP2 and the modulator MOD2 and the demodulator DEM2 in an embodiment for a useful signal routed using differential-path technology, that is to say, on two lines. In such a case, the useful signal is inverted in the modulator MOD2 in a particularly simple manner by reversing the polarity of the alternating component, produced by source Q1, of the useful signal using the modulator switches SM1, SM2. The useful signal has a common-mode voltage indicated by source Q2. For the frequency-compensated amplifier V1, each of the two differential signal lines is provided with a respective compensation network CP2 that respectively includes a first compensation capacitor C1, C1' and a second compensation capacitor C2, C2'. Compensation switches S2, S2', S3, S3' connected to the input of the frequency-compensated amplifier V1, which is in the form of an inverting amplifier stage, can be used to connect or disconnect the compensation capacitors C1, C1', C2, C2'. The demodulator DEM also has demodulator switches SD1, SD2, SD3, SD4 for changing the polarity of the amplified and frequency-compensated useful signal. In addition, an integrator IR is connected downstream of the demodulator switches SD1, SD2, SD3, SD4 and uses integration to eliminate the offset voltage produced by the offset source Q2 from the useful signal produced by source Q1. For resetting purposes, the integrator IR has a reset input RS. Connected to the output of the demodulator DEM2 is a sample-and-hold circuit having a switch SSH and a capacitor CSH.

Figure 3:
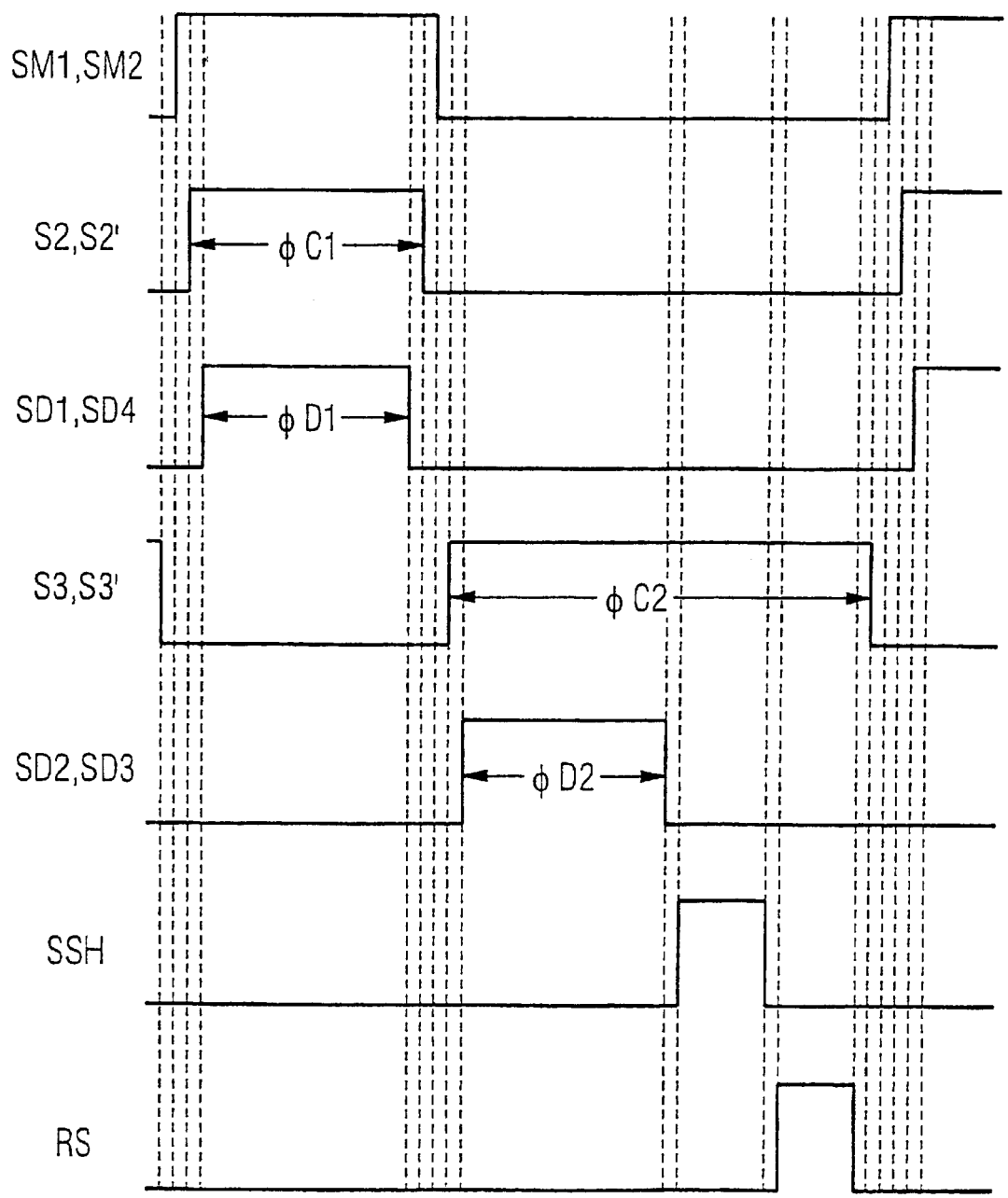
FIG. 3 is a timing diagram illustrating a time profile for actuation of the switches of FIG. 2.

The operation of the circuit shown in FIG. 2 can be understood using the time profiles for the signals controlling the switches, as shown in FIG. 3. The clock signal to be supplied to the modulator to actuate the modulator switches SM1, SM2 has a high state in the first clock phase and has a low state in the second clock phase. During the first clock phase, the first compensation capacitor C1, C1' can be connected using the compensation switches S2, S2'. As compared with the modulator clock signal, the turn-on time of the switches S2, S2' is delayed so that the switches S2, S2' turn on later and turn off earlier. As compared with the first clock phase for the modulator MOD, the first clock phase for the demodulator DEM is shortened once again, as can be seen from the clock signal for the demodulator switches SD1, SD4, to prevent voltage spikes caused by switching from crosstalking on the output signal. When the second compensation capacitors C2, C2' are connected using the switches S3, S3' disposed in series therewith in the second clock phase, a shortened connection interval for the second compensation capacitors can, again, clearly be seen. Such a process has the advantage that the first compensation capacitors C1, C1' and the second compensation capacitors C2, C2' are never connected at the same time. This means that no unwanted charge reversal in the compensation capacitors C1, C1', C2, C2' can take place. The absence of any overlap between the clock signals for the switches for the first and second compensation capacitors results in the amplifier V1 briefly being operated without frequency compensation when switching the clock phase or between the clock phases. These time intervals need to be chosen to be short enough for the amplifier without compensation in the switching times to remain stable. This means that the switching times should be shorter than 10 ns. Switching in the modulator MOD by the modulator switch SM1, SM2 is, preferably, effected in the time interval in which the amplifier is operated without frequency compensation. During the second clock phase for the modulator MOD in line with the switching times for the switches SM1, SM2, the inverted, amplified useful signal is passed to the integrator in the demodulator DEM by the switches SD2, SD3. The turn-on times for the switches SD2, SD3 are, preferably, the same as the turn-on times for the switches SD1, SD4 to achieve a high level of symmetry for the circuit. In the remaining, second clock phase for the modulator, the useful signal integrated in the integrator IR is sampled with the switch SSH once per clock period and is stored on the storage capacitor CSH and is, then, reset by applying a signal RS to the reset input of the integrator IR of same. The requirement of sampling and resetting the demodulator DEM or integrator IR explains the asymmetrical duty cycle in the modulator MOD.

Figure 4:
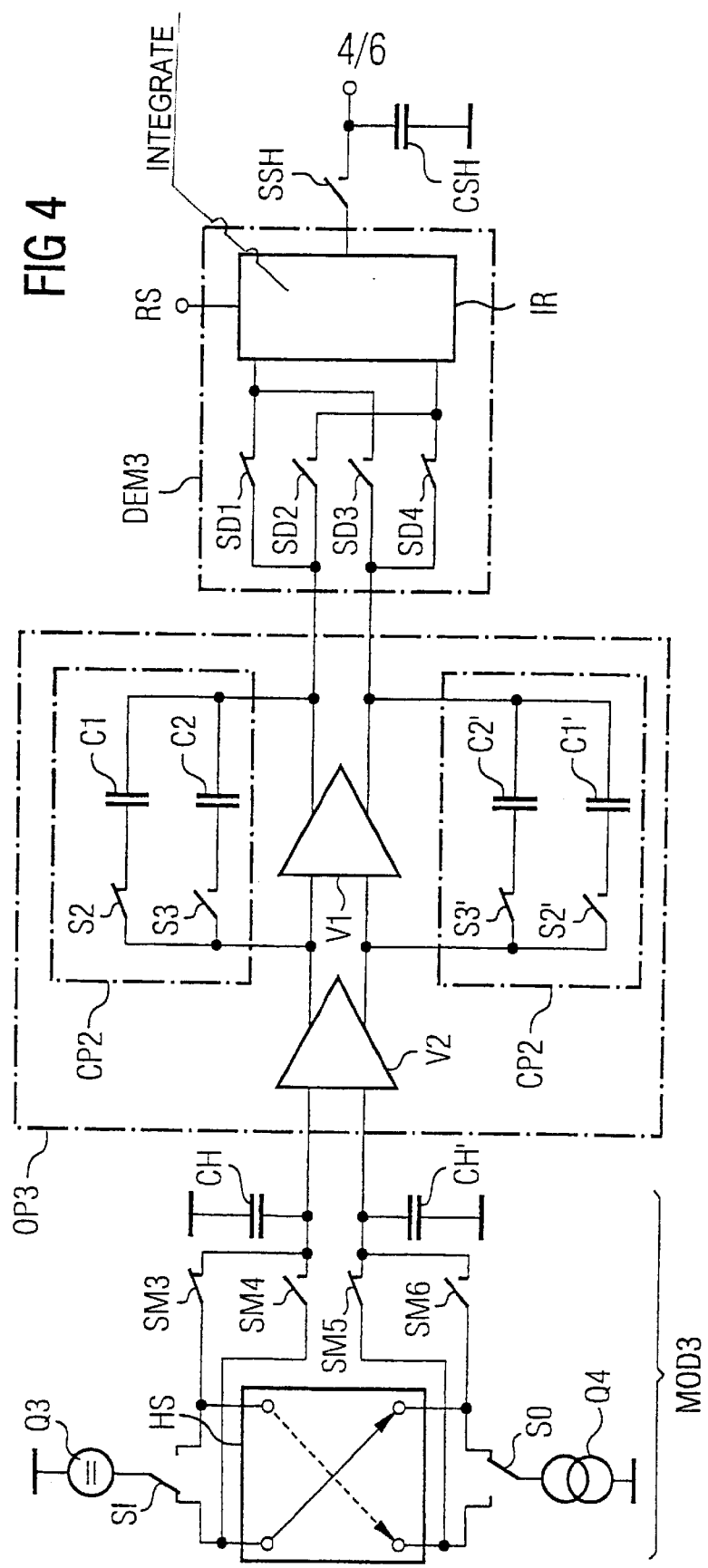
FIG. 4 is a block and schematic circuit diagram of the circuit of FIG. 2 applied to a Hall sensor.

FIG. 4 shows a development of the circuit shown in FIG. 2, matched to the amplifier for a Hall sensor HS. The Hall sensor HS, which is operated in chopped mode, is part of the modulator MOD3 in this case. Four corners of the Hall sensor HS have respective terminals, with an exciter current being fed into diagonally opposite terminals and a Hall voltage being picked off on the other two terminals, and vice-versa. The switching of the terminal pairs, that is to say, the chopping of the Hall element HS, is effected by changeover switches SI, SO that supply the exciter current, represented by grounded sources Q3, Q4, to one diagonal terminal pair or to the other diagonal terminal pair according to the clock phase. In such a case, the changeover switches SI, SO for the exciter current are, respectively, switched at the same time. The Hall voltage is sampled using the sampling switches SM3, SM5 and SM4, SM6. As compared with the timing diagram shown in FIG. 3, it will be noticed from the timing diagram shown in FIG. 5, which explains the circuit shown in FIG. 4, that, in contrast to an ideal signal voltage source as shown in FIG. 2, the switching of SI, SO is followed by a respective period of time elapsing before the transient switching process has died down in the Hall element HS. On account of control loops provided in integrated, multiplying sensors, transient recovery times can arise that are longer than 10 ns. Only when these transient processes have died down can the Hall voltage be connected to the operational amplifier OP3. During the transient recovery time, the potential from the previous clock cycle is held by the holding capacitors CH, CH' at the inputs of the operational amplifier OP3. The operational amplifier OP3, thus, does not react to the transient processes caused by the switching of the Hall sensor HS, which means that discharging or charge reversal processes in the compensation capacitors C1, C1', C2, C2' are avoided. When these transient processes or switching transients have died down, the compensation switches S3, S3' for the second compensation capacitors C2, C2' are switched to high impedance, the first modulator switches SM3, SM5 are switched to low impedance, and the compensation switches S2, S2' for the first compensation capacitors C1, C1' are switched to low impedance in as fast a sequence as possible. The demodulator switches SD1, SD4 are, then, turned on. The detailed signal profiles for the switches can be seen in FIG. 5.

Figure 5:
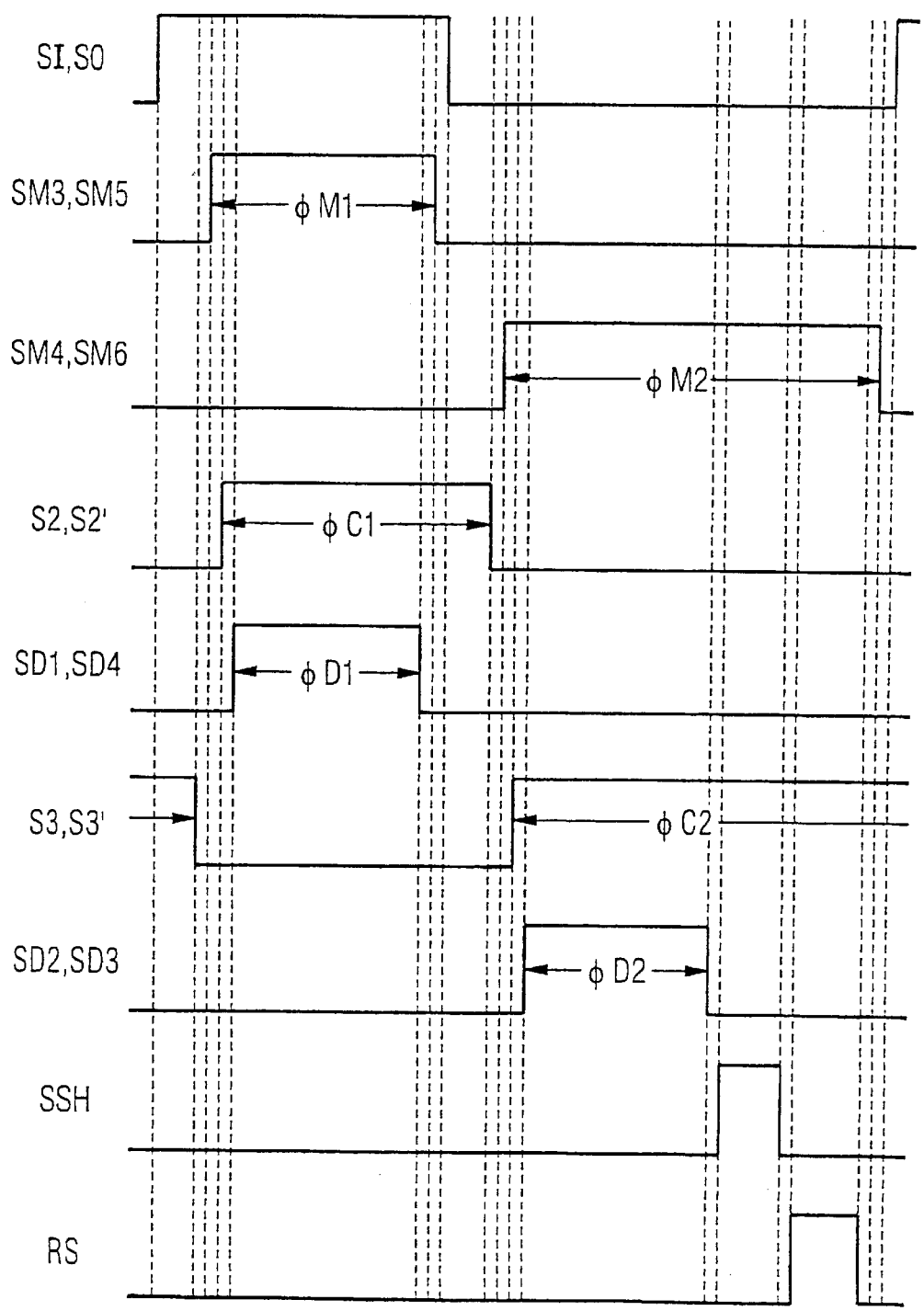
FIG. 5 is a timing diagram illustrating a time profile for the switching signals in FIG. 4.

In line with FIG. 5, the useful signal is split into two cyclically consecutive chopper clock phases that are alternated using changeover switches SI, SO. A first modulator clock phase ΦM1, which can be produced by modulator switches SM3, SM5, is shorter than the first chopper clock phase, in particular, its start is delayed with respect to the start of the chopper clock phase to wait for transient equalization processes. In a similar manner, a second modulator clock phase ΦM2, which can be produced by modulator switches SM4, SM6, is, likewise, shorter than the second chopper clock phase.

Two compensation clock phases ΦC1, ΦC2 are provided, between which a respective no-overlap time is observed to ensure that the first and second compensation capacitors C1, C2 are never active at the same time. The start of the modulator clock phases ΦM1, ΦM2 respectively comes in the no-overlap time.

Two demodulator clock phases ΦD1, ΦD2 each start shortly after the start of the respective compensation clock phase ΦC1, ΦC2 and each end shortly before the end of the respective modulator clock phases ΦM1, ΦM2.

The timing diagram shown in FIG. 5 ensures that spikes caused by switching processes neither arise at the output of the amplifier configuration nor corrupt the respective potential stored on the compensation capacitors C1, C2.

The sampling and resetting of the integration value in the integrator IR using the switch SSH and the capacitor CSH or the reset input RS are effected as already described for FIG. 2 and FIG. 3. As a result, the advantage of offset voltage compensation in a chopped Hall sensor is combined with the opportunity to achieve high chopper clock rates for a small area requirement, a high level of accuracy and low power consumption in the amplifier circuit.

The circuit shown in FIG. 4 with the timing diagram shown in FIG. 5 can, naturally, also be applied to the spinning current Hall principle mentioned in the introduction, in which the exciter current source is cyclically connected to a multiplicity of contact pairs on the Hall sensor so that a clock period is split into the appropriate multiplicity of clock phases. In such a case, the offset component of the Hall voltage is directional. Accordingly, every conventional compensation capacitor needs to be replaced with the multiplicity of switched compensation capacitors, which means that every clock phase is, in turn, associated with a separate compensation capacitor that respectively maintains its charge unchanged during the rest of the clock phases and, thereby, avoids charge reversal and reduces the transient recovery time for the amplifier configuration.

Figure 6:
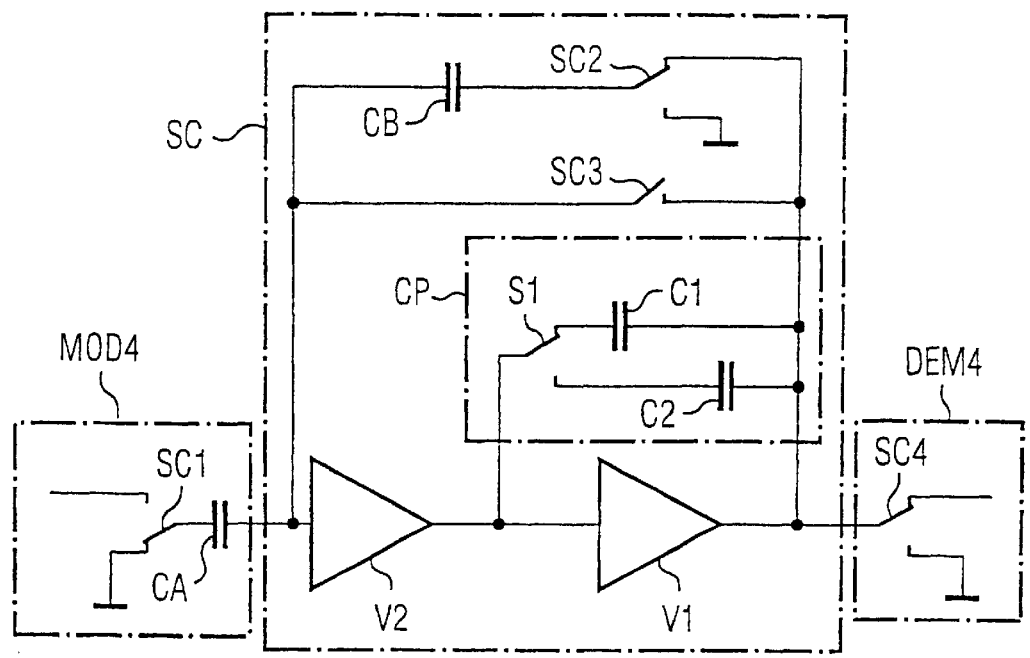
FIG. 6 is a block and schematic circuit diagram of the switching principle according to the invention applied to a switched-capacitor amplifier.

FIG. 6 shows an exemplary embodiment in which the principle described is applied to a switched-capacitor amplifier SC. In such a case, a first switched-capacitor capacitance CA is charged by a switch SC1 in the modulator MOD4, and, then, the first capacitor CA has its charge reversed to that of the second switched-capacitor capacitance CB. To this end and for the purpose of discharging the switched-capacitor capacitances CA, CB, further switches SC2, SC3 are provided. A clock signal derived from the switching clock signal for the first switched-capacitor switch SC1 is used to operate the fourth switched-capacitor switch SC4 in the demodulator DEM4. In the circuit shown in FIG. 6 too, the switched-capacitor amplifier SC amplifies a chopped input signal, so that the compensation circuit CP containing changeover switch S1 and compensation capacitors C1, C2, between which it is possible to switch according to the clock phases, is advantageously used.

In alternative embodiments to FIG. 6, the demodulator DEM4 shown in FIG. 6 can be dispensed with.

Figure 7:
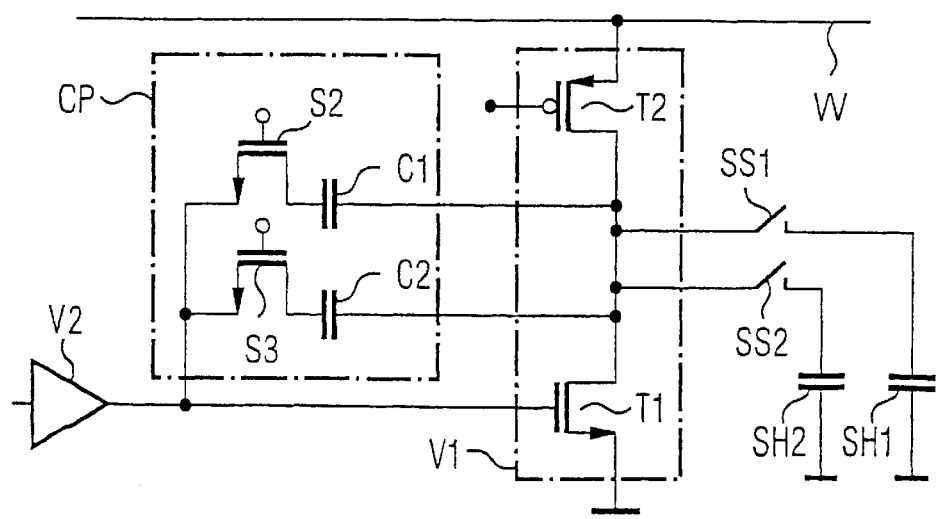
FIG. 7 is a block and schematic circuit diagram of an exemplary embodiment of the amplifier according to the invention having the switched compensation capacitors in CMOS technology.

Finally, FIG. 7 shows an exemplary embodiment for the inverting, frequency-compensated amplifier V1, which is produced using two CMOS transistors T1, T2, and an implementation of the compensation circuit CP containing the compensation capacitors C1, C2 and MOS switches S2, S3. In such a case, it is advantageous for the inputs of the compensation switches S2, S3 to be connected directly to the is amplifier V1, on which there are defined voltage levels, so that the switches S2, S3 can be produced in a simple manner. The amplifier V1 is connected to a supply potential VV and to reference-ground potential. The frequency-compensated amplifier V1 has, in a simple case, two CMOS transistors T1, T2, of which the transistor T2 connected directly to the supply potential allows a bias setting on its gate, and the gate of the transistor T1 that is connected to the reference-ground potential is connected to the output of the further transistor V2, which is connected upstream of the frequency-compensated amplifier V1. The two transistors in the first amplifier V1 are connected to one another by a respective load connection, with a respective sample-and-hold circuit formed by a switch SS1, SS2 and a capacitor SH1, SH2 being provided for the two clock phases.

We claim:
1. A frequency-compensated, multistage amplifier configuration, comprising:
an input amplifier stage having an input and an output;
an output amplifier stage having:
an input connected to said output of said input amplifier stage; and
output;
a modulator connected to said input of said input amplifier stage, said modulator supplying said input amplifier stage with a signal chopped into a first and a second clock phase;
a first Miller compensation capacitor electrically activatable between said input of said output amplifier stage and said output of said output amplifier stage during said first clock phase; and a second Miller compensation capacitor electrically activatable between said input of said output amplifier stage and said output of said output amplifier stage during said second clock phase.

2. The amplifier configuration according to claim 1, including a demodulator connected to said output of said output amplifier stage, said demodulator demodulating an amplified version of the signal.

3. The amplifier configuration according to claim 1, including a demodulator connected to said output of said output amplifier stage, said demodulator demodulating a signal at said out put of said output amplifier stage.

4. The amplifier configuration according to claim 1, wherein said first and second Miller compensation capacitors have substantially equal capacitance values.

5. The amplifier configuration according to claim 1, wherein said first and second Miller compensation capacitors have the same equal capacitance values.

6. The amplifier configuration according to claim 1, including a changeover switch connected to said input of said output amplifier stage, said changeover switch selectively connecting said input of said output amplifier stage to one of said first Miller compensation capacitor and said second Miller compensation capacitor.

7. The amplifier configuration according to claim 1, including a changeover switch connected to said input of said output amplifier stage, said changeover switch said changeover switch switching said first and second Miller compensation capacitors by selectively connecting said input of said output amplifier stage to one of said first Miller compensation capacitor and said second Miller compensation capacitor.

8. The amplifier configuration according to claim 6, wherein said changeover switch for switching said first and second Miller compensation capacitors is an analog circuit with CMOS transistors.

9. The amplifier configuration according to claim 7, wherein said changeover switch for switching said first and second Miller compensation capacitors is an analog circuit with CMOS transistors.

10. The amplifier configuration according to claim 1, wherein the signal is a differential signal.

11. The amplifier configuration according to claim 10, including a respective holding capacitor for signal lines carrying the differential signal between said modulator and said input amplifier stage, said respective holding capacitor being grounded.

12. The amplifier configuration according to claim 10, including:

signal lines carrying the differential signal between said modulator and said input amplifier stage; and a grounded holding capacitor connected to each of said signal lines.

13. The amplifier configuration according to claim 1, wherein said modulator is a Hall sensor operated in chopped mode.

14. The amplifier configuration according to claim 1, wherein said modulator is a chopped mode Hall sensor.

15. The amplifier configuration according to claim 13, including a demodulator connected to said output of said output amplifier stage, said demodulator demodulating a signal at said output of said output amplifier stage and having an integrator integrating the signal at said output of said output amplifier stage.

16. The amplifier configuration according to claim 1, wherein said output amplifier stage is a frequency-compensated amplifier.

17. The amplifier configuration according to claim 16, wherein said frequency-compensated amplifier is a switched-capacitor amplifier.

18. The amplifier configuration according to claim 16, wherein:

said frequency-compensated amplifier has an output; and at least one of said first and second compensation capacitors is grounded at said output of said frequency-compensated amplifier.

19. A method for operating a frequency-compensated amplifier configuration, which comprises:

providing an amplifier configuration having:
an amplifier with an input and an output; and
a modulator connected to the input of the amplifier;

modulating a useful signal in the modulator to form two cyclically consecutive modulator clock phases;

activating a first compensation capacitor between the input of the amplifier and the output of the amplifier during a first compensation clock phase;

activating a second compensation capacitor between the input of the amplifier and the output of the amplifier during a second compensation clock phase; and providing a respective no-overlap time between the first and second compensation clock phases during which neither the first compensation capacitor nor the second compensation capacitor is switched on.

20. The method according to claim 19, wherein:

a start of the first modulator clock phase comes in the no-overlap time between the second and first compensation clock phases; and the start of the second modulator clock phase comes in the no-overlap time between the first and second compensation clock phases.

21. The method according to claim 20, wherein the amplifier is a frequency-compensated amplifier; and which further comprises demodulating an amplified version of the useful signal with a demodulator connected downstream of the frequency-compensated amplifier such that the amplified useful signal can be derived at the output of the frequency-compensated amplifier unchanged during a first demodulator clock phase and in an inverted form during a second demodulator clock phase, the first demodulator clock phase starting after the start of the first compensation clock phase and ending before an end of the first modulator clock phase, and the second demodulator clock phase starting after the start of the second compensation clock phase and ending before an end of the second modulator clock phase.

* * * * *

UNITED STATES PATENT AND TRADEMARK OFFICE
CERTIFICATE OF CORRECTION

PATENT NO.    : 6,621,334 B2
DATED         : September 16, 2003
INVENTOR(S)   : Udo Ausserlechner et al.

It is certified that error appears in the above-identified patent and that said Letters Patent is hereby corrected as shown below:

<u>Title page,</u>
Insert Item
-- [30]    Foreign Application Priority Data

June 28, 2000    (DE) ............... 100 31 522.4 --

Signed and Sealed this

Tenth Day of February, 2004

JON W. DUDAS
*Acting Director of the United States Patent and Trademark Office*